(12) United States Patent
Ling et al.

(10) Patent No.: US 8,982,832 B2
(45) Date of Patent: Mar. 17, 2015

(54) WIRELESS COMMUNICATION OF TURBO CODED DATA WITH TIME DIVERSITY

(75) Inventors: Fuyun Ling, San Diego, CA (US); Thomas Sun, San Diego, CA (US); Tao Tian, San Diego, CA (US); Raghuraman Krishnamoorthi, San Diego, CA (US); Jing Jiang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 857 days.

(21) Appl. No.: 12/165,663

(22) Filed: Jul. 1, 2008

(65) Prior Publication Data

US 2009/0268694 A1 Oct. 29, 2009

Related U.S. Application Data

(60) Provisional application No. 61/048,487, filed on Apr. 28, 2008.

(51) Int. Cl.
*H04W 4/00* (2009.01)
*H04J 3/00* (2006.01)
*H03M 13/29* (2006.01)
*H04L 1/00* (2006.01)

(52) U.S. Cl.
CPC ......... *H03M 13/2957* (2013.01); *H04L 1/0066* (2013.01); *H04L 1/0071* (2013.01)
USPC .............................. 370/330; 370/336; 370/345

(58) Field of Classification Search
USPC ................... 370/336, 330, 345; 714/751, 752
See application file for complete search history.

(56) References Cited

U.S. PATENT DOCUMENTS

| 6,339,781 | B1 | 1/2002 | Sasaki |
| 6,598,202 | B1 | 7/2003 | Kim et al. |
| 6,625,234 | B1 | 9/2003 | Cui et al. |
| 6,748,566 | B1 * | 6/2004 | Laroia et al. ................... 714/751 |
| 6,920,602 | B1 | 7/2005 | Park et al. |
| 6,928,604 | B2 * | 8/2005 | Park et al. ...................... 714/788 |
| 6,973,611 | B2 * | 12/2005 | Dabak et al. ................... 714/755 |
| 7,490,282 | B2 * | 2/2009 | Spencer et al. ................ 714/755 |
| 7,646,805 | B2 | 1/2010 | Cho |

(Continued)

FOREIGN PATENT DOCUMENTS

| CN | 1414724 A | 4/2003 |
| CN | 101040478 A | 9/2007 |

(Continued)

OTHER PUBLICATIONS

3GPP TS 25.101;Third Generation Partnership Project; Technical Specification Group Radio Access Network; User Equipment (UE) radio transmission and reception (FDD) ;3GPP TS 25.101 version 5.20.0 Release 5; Dec. 2006.*

(Continued)

*Primary Examiner* — Derrick Ferris
*Assistant Examiner* — Kodzovi Acolatse
(74) *Attorney, Agent, or Firm* — Arent Fox, LLP (57) ABSTRACT

A turbo-coded data block is processed for transmission on a wireless communication link by scheduling a plurality of portions of the block for transmission during respectively corresponding transmit intervals that are temporally separated from one another. The block portions are transmitted during the respectively corresponding transmit intervals according to the scheduling.

29 Claims, 7 Drawing Sheets

(56) References Cited

U.S. PATENT DOCUMENTS

| | | | |
|---|---|---|---|
| 7,992,070 | B2 | 8/2011 | Djordjevic et al. |
| 2001/0033560 | A1* | 10/2001 | Tong et al. ............... 370/337 |
| 2002/0114270 | A1 | 8/2002 | Pierzga et al. |
| 2002/0126763 | A1* | 9/2002 | Jeong et al. ............... 375/295 |
| 2002/0181603 | A1* | 12/2002 | Kim et al. ............... 375/265 |
| 2003/0043928 | A1* | 3/2003 | Ling et al. ............... 375/267 |
| 2003/0063606 | A1 | 4/2003 | Odenwalder et al. |
| 2003/0188247 | A1 | 10/2003 | Ahmed et al. |
| 2005/0101319 | A1* | 5/2005 | Murali et al. ............... 455/434 |
| 2005/0141475 | A1* | 6/2005 | Vijayan et al. ............... 370/345 |
| 2006/0095827 | A1 | 5/2006 | Spencer et al. |
| 2006/0101168 | A1 | 5/2006 | Roh et al. |
| 2006/0171283 | A1* | 8/2006 | Vijayan et al. ............... 369/94 |
| 2006/0183287 | A1 | 8/2006 | Collins et al. |
| 2006/0195752 | A1 | 8/2006 | Walker et al. |
| 2006/0198454 | A1 | 9/2006 | Chung et al. |
| 2006/0218472 | A1 | 9/2006 | Dahl et al. |
| 2007/0088971 | A1 | 4/2007 | Walker et al. |
| 2007/0157065 | A1* | 7/2007 | Pons et al. ............... 714/758 |
| 2008/0020786 | A1 | 1/2008 | Smith et al. |
| 2008/0087729 | A1 | 4/2008 | Yee et al. |
| 2009/0013356 | A1 | 1/2009 | Doerr et al. |
| 2009/0059086 | A1 | 3/2009 | Lee et al. |
| 2009/0235141 | A1 | 9/2009 | Shelby et al. |
| 2010/0260161 | A1 | 10/2010 | Van Veen et al. |
| 2011/0047434 | A1 | 2/2011 | Walker et al. |

FOREIGN PATENT DOCUMENTS

| | | |
|---|---|---|
| CN | 101091346 A | 12/2007 |
| WO | WO2006126004 A1 | 11/2006 |
| WO | WO2007115333 A2 | 10/2007 |

OTHER PUBLICATIONS

International Preliminary Report on Patentability, PCT/US2009/041761, International Preliminary Examining Authority, European Patent Office, Jun. 9, 2010.

"Universal Mobile Telecommunications System (UMTS); User Equipment (UE) radio transmission and reception (FDD) (3GPP TS 25.101 version 7.10.0 Release 7); ETSI TS 125 101", ETS Standards, Sophia Antipolis Cedex, France, vol. 3-R4, No. V7.10.0, Jan. 1, 2008, XP014040597, Issn: 0000-0001, Figures A.2, A.3, A.6, A.7, A.8A.

TIA "Forward Link Only Air Interface Specification Rev. 1.1", Internet Citation, Dec. 22, 2005 (Dec. 12, 2005), XP002387062, Retrieved from the Internet: URL:http://ftp.tiaonlineorg/TR-47/TR471/Working/20060110-Arlington-meeting1/TR471-20060110-004a_FLO%20AIS.pdf> [retrieved on Jun. 26, 2006], p. 5.10, p. 5.32-p. 5.33, p. 5.43-p. 5.44, Tables 5.2.1.2.8-1, Figures 5.2.1.2.9.6.1.4-2, Figures 5.2.1.2.9.6.1.4-3, figures 5.2.1.2.9.6.1.4-4, Figures 5.2.1.2.9.2-1.

Murali R Chari et al: "FLO Physical Layer: An Overview", IEEE Transactions on Broadcasting, IEEE Service Center, Piscataway, NJ, US, vol. 53, No. 1, Mar. 1, 2007, pp. 145-160, XP011172013, Issn: 0018-9316 the whole document.

Khaled Daoud Ed—Chin E Lin et al; "Performance Comparison of the DVB-H and FLO Mobile Broadcasting Systems", Consumer Electronics, 2007. ISCE 2007. IEEE International Symposium on, IEEE, PI, Jun. 1, 2007, pp. 1-6, XP031160314, ISBN: 978-1-4244-1109-2 the whole document.

International Search Report, PCT/US2009/041761, International Searching Authority, European Patent Office, Jul. 24, 2009.

Written Opinion, PCT/US2009/041761, International Searching Authority, European Patent Office, Jul. 24, 2009.

Advanced Television Systems Committee: "ATSC Mobile DTV Standard, Part 2—RF/Transmission System Characteristics (A/1 53 Part 2.2009)", Internet Citation, Oct. 15, 2009, pp. 1-94, XP002571574, [retrieved on 2010-03-051].

"Forward Link Only Air Interface Specification for Terrestrial Mobile Multimedia Multicast: TIA-1099" EIMIA Standards, Telecomm. Industry Assoc., Aug. 1, 2006, XP017005609, Arlington, VA, Secs. 5.2.1.2.9.2.7, 5.2.1.2.9.2.8, 5.2.1.2.10.

Rohde&Schwarz (ATSC Mobile DTV; Application Note; 05-2009-7EB01-OE).

Todd K. Moon: "Error Correction Coding" Jun. 6, 2005, Wiley-Interscience, New Jersey, XP002586308 ISBN: 9780471648000, pp. 618-618.

Taiwan Search Report—TW098114067—TIPO—Sep. 18, 2012.

3GPP, "3rd Generation Partnership Project; Technical Specification Group Radio Access Network; Multiplexing and channel coding (FDD) (Release 7)", 3GPP Standard; 3GPP TS 25.212, 3rd Generation Partnership Project (3GPP), Mobile Competence Centre ; 650, Route Des Lucioles ; F-06921 Sophia-Antipolis Cedex ; France, No. V7.7.0, Nov. 1, 2007, pp. 1-98, XP050366769.

* cited by examiner

| Frame 1 | Frame 2 | Frame 3 | Frame 4 |
|---------|---------|---------|---------|
| $X_0$ | $Y_{0,0}$ | $Y'_{0,1}$ | $X_1$ |
| $Y_{1,0}$ | $Y'_{1,1}$ | $X_2$ | $Y_{2,0}$ |
| $Y'_{2,1}$ | $X_3$ | $Y_{3,0}$ | $Y'_{3,1}$ |

FIG. 7

| Frame 1 | Frame 2 | Frame 3 | Frame 4 |
|---------|---------|---------|---------|
| $X_0$ | $Y_{0,0}$ | $X_1$ | $X_2$ |
| $X_3$ | $Y'_{3,1}$ | $X_4$ | $Y_{4,0}$ |
| $X_5$ | $X_6$ | $X_7$ | $Y'_{7,1}$ |

| Bit Group | Frame 1 | Frame 2 | Frame 3 | Frame 4 |
|---|---|---|---|---|
| 0 | $X_0$ | $Y_{0,0}$ | $X_1$ | $Y'_{1,1}$ |
| 1 | $Y'_{3,1}$ | $X_2$ | $Y_{2,0}$ | $X_3$ |
| 2 | $X_4$ | $Y_{4,0}$ | $X_5$ | $Y'_{5,1}$ |
| 3 | $Y'_{7,1}$ | $X_6$ | $Y_{6,0}$ | $X_7$ |

WIRELESS COMMUNICATION OF TURBO CODED DATA WITH TIME DIVERSITY

RELATED APPLICATIONS

This application claims the benefit of priority from U.S. provisional patent Application Ser. No. 61/048,487, filed Apr. 28, 2008 and entitled "Turbo Coding Over Multiple Frames with Better Time Diversity," which is fully incorporated herein by reference for all purposes.

BACKGROUND

Field

The present disclosure relates generally to communication systems and methods and, more particularly, to wireless communications that use turbo coding.

BACKGROUND

Forward Link Only (FLO) is a digital wireless technology that has been developed by an industry-led group of wireless providers. FLO technology uses advances in coding and interleaving to achieve high-quality reception, both for real-time content streaming and other data services. FLO technology can provide robust mobile performance and high capacity without compromising power consumption. The technology also reduces the network cost of delivering multimedia content by dramatically decreasing the number of transmitters needed to be deployed. In addition, FLO technology-based multimedia multicasting compliments wireless operators' cellular network data and voice services, delivering content to the same cellular mobile terminals used in 3G networks.

Today, FLO technology is used to create and broadcast real time multimedia content across various networks to a large number of mobile subscribers. These mobile subscribers generally employ a FLO receiver, which can be described conceptually with a reference model comprising a number of processing layers, typically referred to as a "protocol stack". Each processing layer includes one or more entities that perform specific functions.

An attractive feature of the protocol stack employed by the FLO receiver is that each layer is self-contained so that the functions performed by one layer can be performed independently of the functions performed by the other layers. This allows improvements to be made to the FLO receiver for one layer without adversely affecting the other layers. However, various challenges are posed when designing the interface between layers in the FLO receiver. Efficient communications across layers in terms of efficient reception of multicast services is always an objective for the FLO receiver designer.

Figure 1:
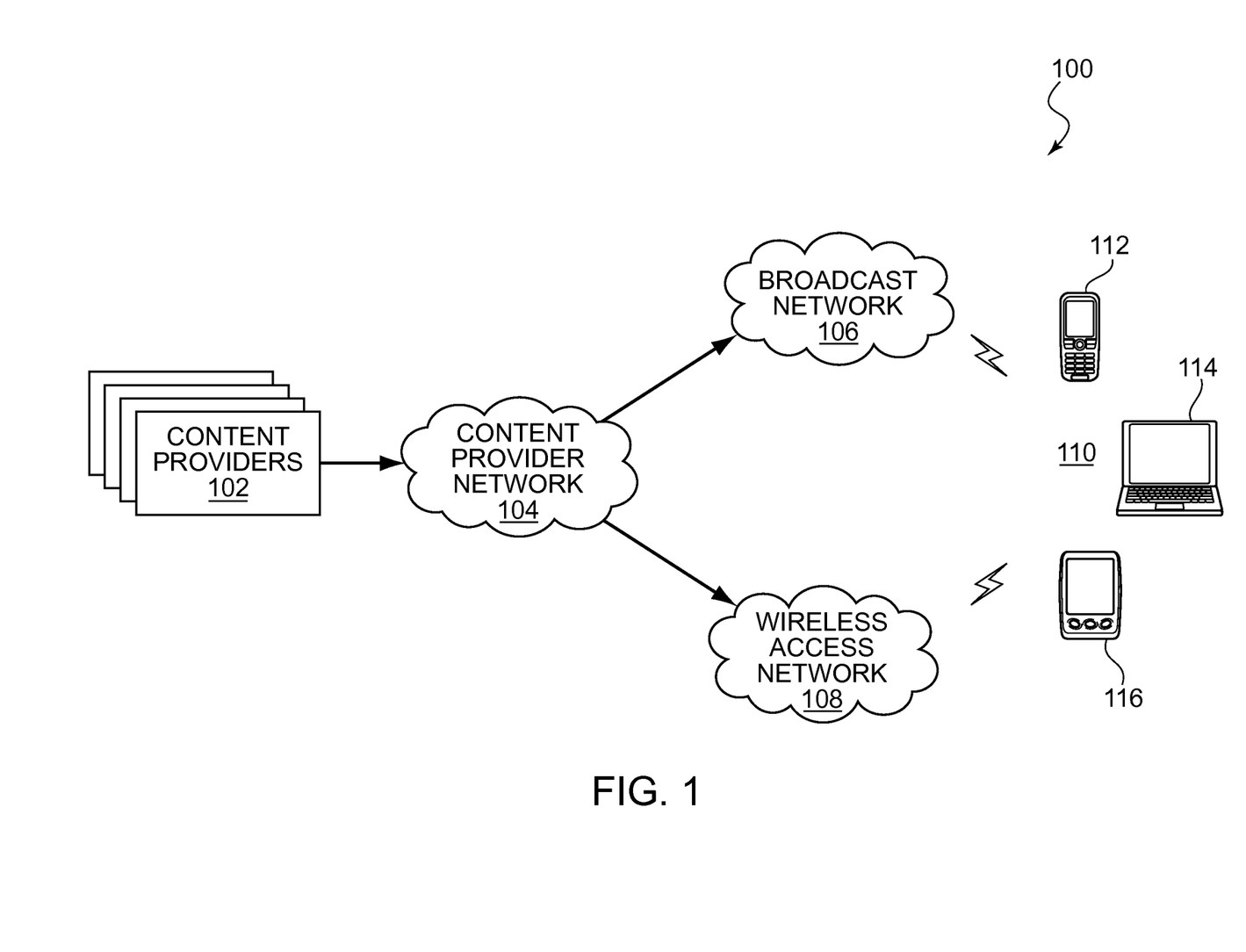
FIG. 1 is a conceptual diagram illustrating an example of a communications system according to the prior art.

FIG. 1 shows a communications system 100 that creates and broadcasts multimedia content across various networks to a large number of mobile subscribers. The communications system 100 includes any number of content providers 102, a content provider network 104, a broadcast network 106, and a wireless access network 108. The communications system 100 is also shown with a number of devices 110 used by mobile subscribers to receive multimedia content. These devices 110 include a mobile telephone 112, a personal digital assistant (PDA) 114, and a laptop computer 116. The devices 110 illustrate just some of the devices that are suitable for use in the communications systems 100. It should be noted that although three devices are shown in FIG. 1, virtually any number of analogous devices or types of devices are suitable for use in the communications system 100, as would be apparent to those skilled in the art.

The content providers 102 provide content for distribution to mobile subscribers in the communications system 100. The content may include video, audio, multimedia content, clips, real-time and non real-time content, scripts, programs, data or any other type of suitable content. The content providers 102 provide content to the content provider network for wide-area or local-are distribution.

The content provider network 104 comprises any combination of wired and wireless networks that operate to distribute content for delivery to mobile subscribers. In the example illustrated in FIG. 1, the content provider network 104 distributes content through a broadcast network 106. The broadcast network 106 comprises any combination of wired and wireless proprietary networks that are designed to broadcast high quality content. These proprietary networks may be distributed throughout a large geographic region to provide seamless coverage to mobile devices. Typically, the geographic region will be divided into sectors with each sector providing access to wide-area and local-area content.

The content provider network 104 may also include a content server (not shown) for distribution of content through a wireless access network 108. The content server communicates with a base station controller (BSC) (not shown) in the wireless access network 108. The BSC may be used to manage and control any number of base transceiver stations (not explicitly shown) depending on the geographic reach of the wireless access network 108. The base transceiver stations (BTSs) provide access to wide-area and local-area for the various devices 110.

The multimedia content broadcast by the content providers 102 include one or more services. A service is an aggregation of one or more independent data components. Each independent data component of a service is called a flow. By way of example, a cable news service may include three flows: a video flow, an audio flow, and a control flow.

Services are carried over one of more logical channels. In FLO applications, a logical channel is often referred to as a Multicast Logical Channel (MLC). A logical channel may be divided into multiple logical sub-channels. These logical sub-channels are called streams. Each flow is carried in a single stream. The content for a logical channel is transmitted through the various networks in a physical frame. In FLO applications, the physical frame is often referred to as a superframe.

The air interface used to transmit the physical frames to the various devices 110 shown in FIG. 1 may vary depending on the specific application and the overall design constraints. In general, communication systems employing FLO technology utilize Orthogonal Frequency Division Multiplexing (OFDM), which is also utilized by Digital Audio Broadcasting (DAB), Terrestrial Digital Video Broadcasting (DVB-T), and Terrestrial Integrated Services Digital Broadcasting (ISDB-T). OFDM is a multi-carrier modulation technique that effectively partitions the overall system bandwidth into multiple (N) sub-carriers. These sub-carriers, which are also referred to as tones, bins, frequency channels, etc., are spaced apart at precise frequencies to provide orthogonality. Content may be modulated onto the sub-carriers by adjusting each sub-carrier's phase, amplitude or both. Typically, quadrature phase shift keying (QPSK) or quadrature amplitude modulation (QAM) is used, but other modulation schemes may also be used.

Figure 2:
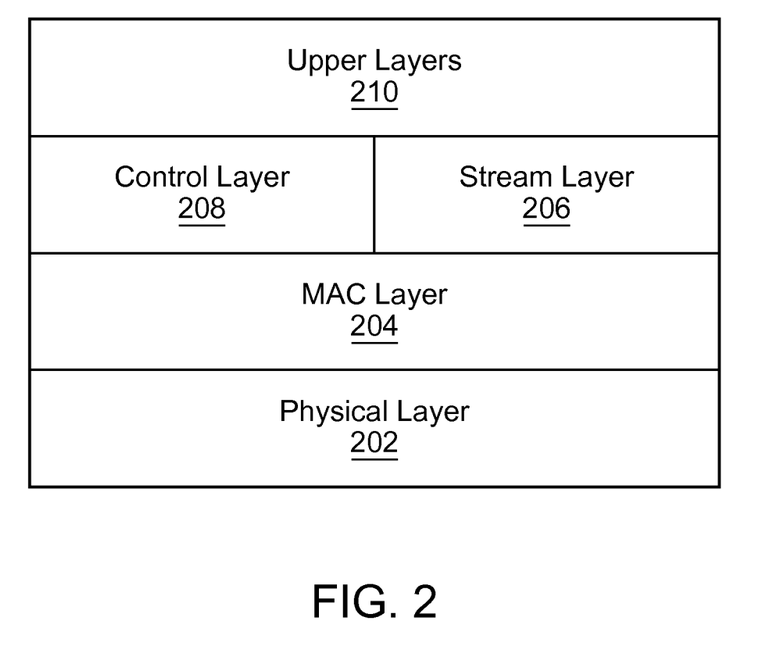
FIG. 2 is a conceptual diagram illustrating an example of a protocol stack for a receiver in the communication system of FIG. 1.

FIG. 2 is a conceptual diagram illustrating an example of a protocol stack 200 for the receiver used in one or more of the devices 110 shown in FIG. 1. The protocol stack is shown with a physical layer 202, a Medium Access Control (MAC) layer 204, a stream player 206, a control layer 208, and a number of upper layers 210. The upper layers 210 provide multiple functions including compression of multimedia content and controlling access to the multimedia content. The control layer 208 is used to process control information that facilitates the operation of the device in the communications system. The receiver also uses the control layer to maintain synchronization of its control information with that in the communications system. The stream layer 206 provides for binding of upper layer flows to streams. The stream layer is at the same level as the control layer in the protocol stack 200 of the receiver. The MAC layer 204 provides multiplexing of packets belonging to different media streams associated with the logical channels. The MAC layer 204 defines the procedures used to receive and transmit over the physical layer 202. The physical layer provides the channel structure, frequency, power output modulation and encoding specification for the air interface.

It is well known that the quality of communication over fading channels may be improved by using time diversity techniques. It is therefore desirable to provide for opportunities to improve time diversity.

SUMMARY

A turbo-coded data block is processed for transmission on a wireless communication link by scheduling a plurality of portions of the block for transmission during respectively corresponding transmit intervals that are temporally separated from one another. The block portions are transmitted during the respectively corresponding transmit intervals according to the scheduling.

BRIEF DESCRIPTION OF THE DRAWINGS

Various aspects of a wireless communications system are illustrated by way of example, and not by way of limitation, in the accompanying drawings, wherein.

DETAILED DESCRIPTION

The detailed description set forth below in connection with the appended drawings is intended as a description of various embodiments of the invention and is not intended to represent the only embodiments in which the invention may be practiced. The detailed description includes specific details for the purpose of providing a thorough understanding of the invention. However, it will be apparent to those skilled in the art that the invention may be practiced without these specific details. In some instances, well known structures and components are shown in block diagram form in order to avoid obscuring the concepts of the invention.

Various concepts herein are described in the context of a FLO technology. While these concepts may be well suited for this application, those skilled in the art will readily appreciate that these concepts are likewise applicable to other technology. Accordingly, any reference to FLO technology is intended only to illustrate theses concepts, with the understanding that such concepts have a wide range of applications.

Figure 3:
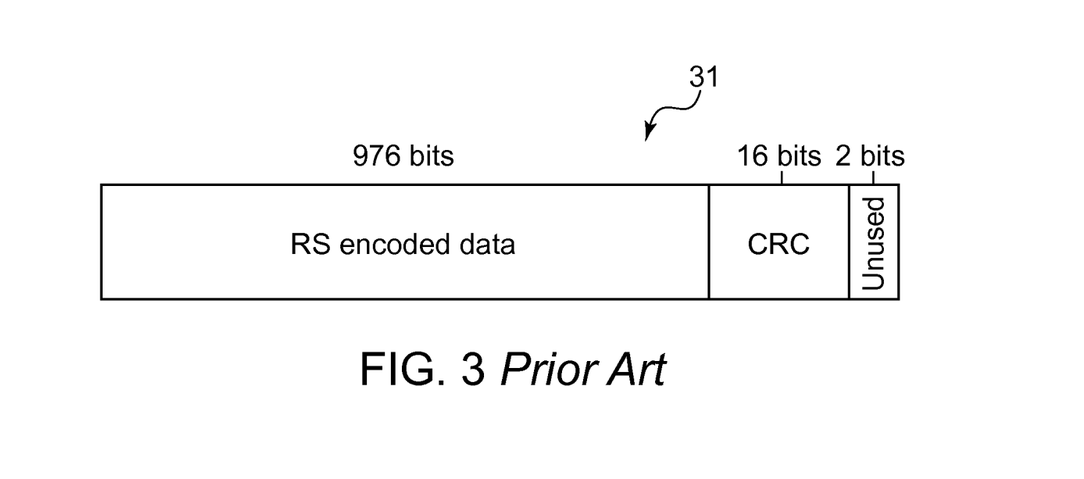
FIG. 3 conceptually illustrates the structure of a prior art MAC packet.

In conventional systems such as described above with respect to FIGS. 1 and 2, the encoding/decoding scheme for detecting and correcting errors utilizes a Reed-Solomon (RS) encoding/decoding in combination with turbo encoding/decoding. At the transmitter, the data bits are RS encoded and organized as RS code blocks. Each RS code block consists of sixteen MAC packets. Each MAC packet contains 994 bits organized as shown at 31 in FIG. 3. The bits of each MAC packet 31 are turbo encoded to produce a corresponding turbo packet. Thus, the turbo encoding of each RS code block produces sixteen turbo packets.

The sixteen turbo packets are distributed equally across a FLO transmission superframe. A transmission superframe has a length of one second, and consists of four frames, each of which has a length of approximately 0.25 seconds. Each frame of a superframe contains four of the aforementioned turbo packets. The turbo encoded bits of each turbo packet are mapped into QPSK, 16 QAM, or layered QPSK modulation symbols, which are modulated onto subcarriers of one OFDM symbol (or a few adjacent OFDM symbols) in the same frame. There are 1,200 OFDM signals in a superframe. The encoded bits in a turbo packet are transmitted at the same time if the turbo packet is scheduled on a single OFDM symbol, or they are transmitted temporally closely to one other if the turbo packet is scheduled on adjacent OFDM symbols. As a result, turbo encoding/decoding in conventional FLO technology utilizes very limited time diversity, especially for mobile receivers moving at low speeds. Time diversity is achieved primarily due to the RS encoding/decoding.

Figure 4:
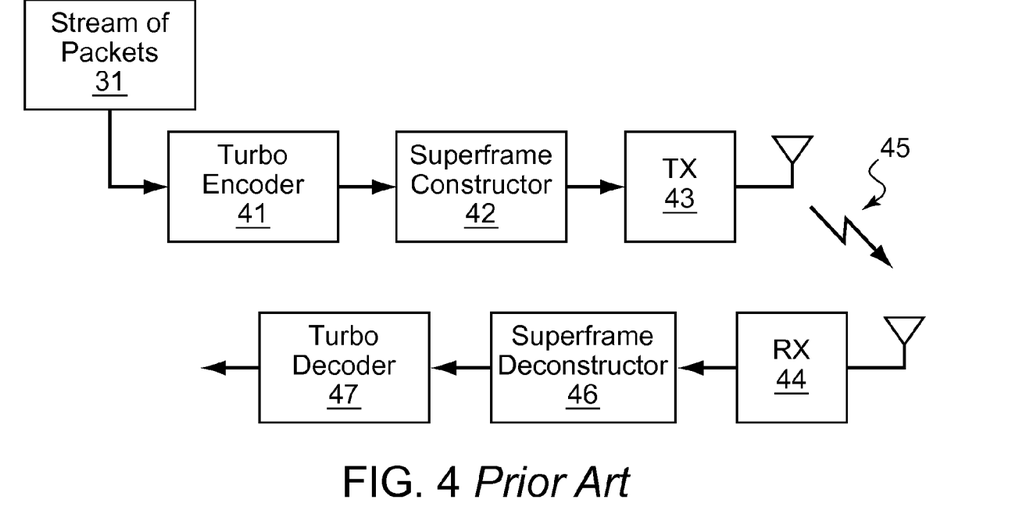
FIG. 4 diagrammatically illustrates a prior art communication system that uses the MAC packet structure of FIG. 3.

FIG. 4 diagrammatically illustrates details of a prior art communication system (such as the system of FIG. 1) that uses the above-described coding and transmission techniques. A turbo encoder 41 receives a stream of MAC packets 31, sixteen per RS code block, and turbo encodes the MAC packets 31 to produce respectively corresponding turbo packets. A superframe constructor 42 distributes the sixteen turbo packets associated with each RS code block equally across the four frames of a superframe, four turbo packets per frame. The superframe is passed to a transmit unit 43 that transmits the superframes via suitable transmit signaling on a wireless communication link 45. A receive unit 44 receives the transmit signaling, extracts the transmitted superframes, and passes the superframes to a superframe deconstructor 46 that extracts the sixteen turbo packets from the superframe. The superframe deconstructor 46 provides the extracted turbo packets to a turbo decoder 47 where they are turbo decoded.

Figure 5:
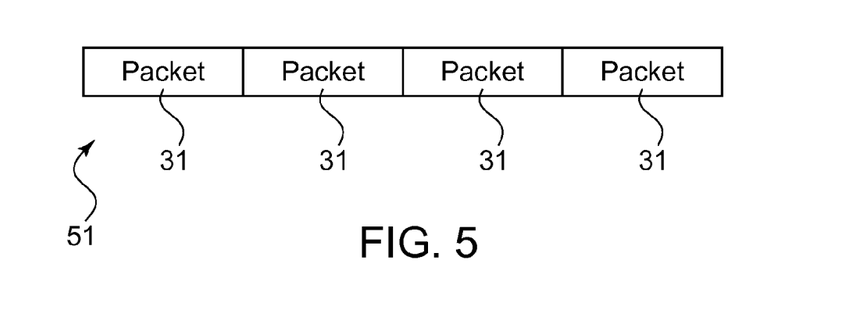
FIG. 5 conceptually illustrates a composite packet used according to exemplary embodiments of the present work.

It is known in the art that, by increasing the length of the turbo packets, the performance in an AWGN (additive white Gaussian noise) channel may be improved by a few tenths of a dB. This performance improvement could be obtained, for example, by configuring the turbo encoder to encode four of the MAC packets 31 of the RS code block into a single turbo packet that is four times the length of the conventional turbo packet described above, or encoding eight of the MAC packets 31 into a single turbo packet that is eight times the length of the conventional turbo packet, or encoding all sixteen of the MAC packets of an RS code block into a single turbo packet that is sixteen times the length of the conventional turbo packet. The aforementioned example of four MAC packets 31 grouped together as a longer, composite packet 51 for turbo encoding is shown in FIG. 5. The turbo packets produced by encoding a longer, composite packet such as shown at 51 are also referred to herein as extended length turbo packets or extended length turbo blocks (or simply turbo blocks), in order to distinguish them from a conventional turbo packet produced by turbo encoding a single MAC packet 31. The extended length turbo block produced by turbo encoding the composite packet 51 of FIG. 5 is four times the length of one of the turbo packets produced by the turbo encoder in FIG. 4, and may thus be scheduled for transmission on a single frame within the superframe, using the same OFDM symbols that are occupied by four separate turbo packets in transmissions according to FIG. 4.

Exemplary embodiments of the present work recognize that, by distributing each extended length turbo block across multiple frames of a superframe, better time diversity and improved system performance under time varying fading channels may be achieved. In some embodiments, the turbo block produced by turbo encoding the composite packet 51 of FIG. 5 is divided into 4 sub-blocks, and each sub-block is scheduled in a different frame of the superframe. The use of sub-blocks scheduled in respectively different frames provides time diversity, so RS coding is eliminated in some embodiments (which frees capacity for transmission of additional user data).

Figure 6A:
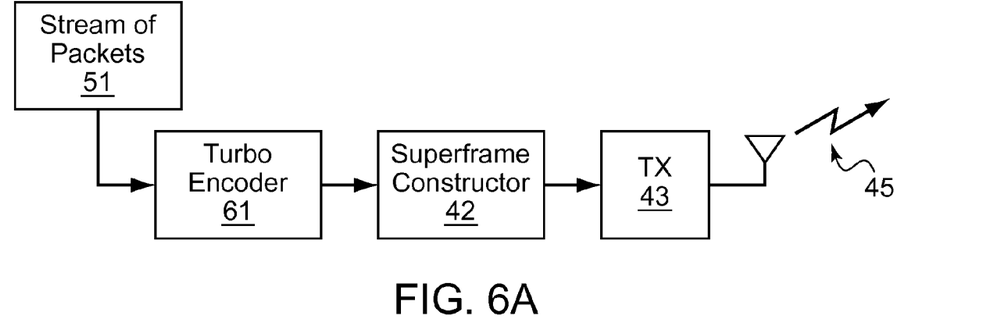
FIGS. 6A-6D diagrammatically illustrate a transmit end of a communication system according to exemplary embodiments of the present work.

FIG. 6A diagrammatically illustrates the transmit end of a communication system according to exemplary embodiments of the present work. The transmit end of FIG. 6A is generally similar to that of FIG. 4, but uses a turbo encoder 61 that encodes the extended length turbo blocks described above. Taking the example of the composite packets 51 in FIG. 5, a turbo encoder 61 receives a stream of the composite packets, and turbo encodes the composite packets to produce respectively corresponding turbo blocks. FIG. 6A illustrates the aforementioned embodiments wherein each turbo block (which is four times the length of the aforementioned conventional turbo packet) is scheduled by superframe constructor 42 for transmission in a respectively corresponding frame within the superframe. The superframe is passed to the transmit unit 43 for transmission as in FIG. 4.

Figure 6B:
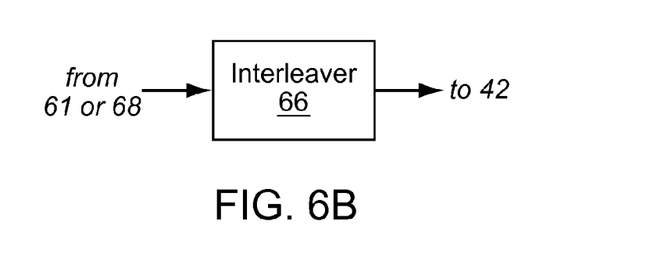
Figure 6C:
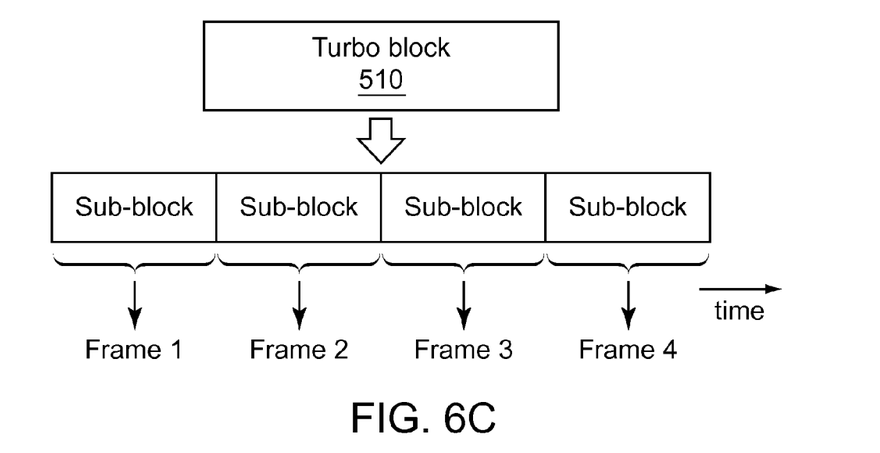

FIGS. 6B and 6C diagrammatically illustrate the aforementioned exemplary embodiments wherein each turbo block is divided into 4 sub-blocks, and each sub-block is scheduled in a different frame of the superframe. An interleaver 66 in FIG. 6B receives the turbo blocks, for example, turbo blocks 510 (FIG. 6C) produced from the composite packets 51 of FIG. 5, from the turbo encoder 61. In some embodiments, the interleaver 66 divides each of the turbo blocks into four equally-sized sub-blocks as shown in FIG. 6C, and interleaves the sub-blocks appropriately to cause the superframe constructor 42 to schedule each sub-block in a respectively different frame of the superframe. For example, as shown in FIG. 6C the first of the four sub-blocks may be scheduled for the first frame (frame 1) of the superframe, the second of the four sub-blocks may be scheduled for the second frame (frame 2), and so on. This particular scheme of apportioning the sub-blocks among the frames is generally referred to herein as a round-robin scheme. Taking the aforementioned example of a FLO transmission superframe, the transmitted sub-blocks in FIG. 6C are separated from each other in time by approximately 0.25 seconds.

Figure 7:
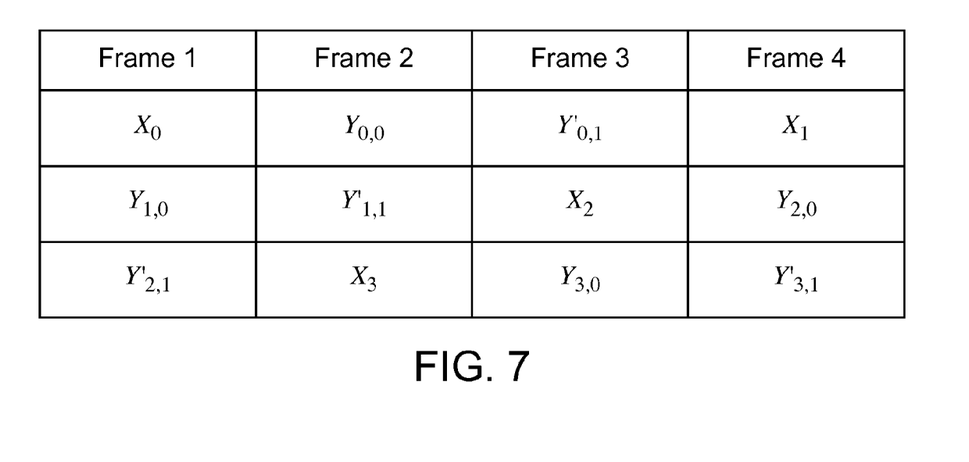
FIGS. 7-10 illustrate results achieved using bit interleaving techniques according to exemplary embodiments of the present work.
Figure 8:
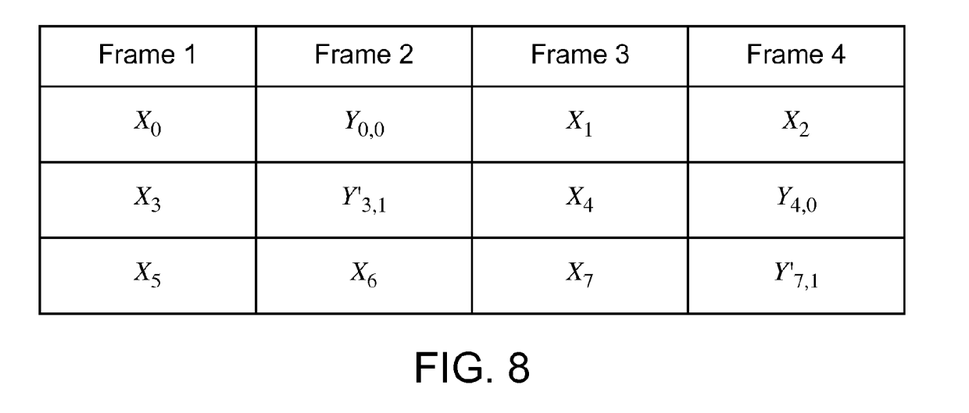

Some embodiments achieve additional time diversity by applying bit-level interleaving to each turbo block. In such embodiments, the interleaver 66 of FIG. 6B interleaves the bits of the turbo block appropriately to cause the scheduler 42 to schedule adjacent bits of the turbo block in different frames. FIGS. 7 and 8 illustrate results of this bit-level interleaving according to exemplary embodiments of the present work.

Some conventional systems such as shown in FIGS. 1 and 2 support turbo code rates of 1/5, 1/3, 1/2, and 2/3, where the latter three code rates are punctured from the 1/5 code rate. In one conventional example of a rate 1/3 turbo code, the output bits of the turbo encoder are in the order of $X_0, Y_{0,0}, Y'_{0,1} X_1, Y_{1,0}, Y'_{1,1}, X_2, Y_{2,0}, Y'_{2,1}, X_3, Y_{3,0}, Y'_{3,1}$, where the $X_i$ are the systematic bits, the $Y_{i,0}$ are the corresponding first parity bits of the first constituent code, and the $Y'_{i,1}$ are the corresponding second parity bits of the second constituent code.

For purposes of exposition, the 1/3 rate turbo code will be used as an example, taken together with the aforementioned example of four frames per superframe. In this exemplary scenario, some embodiments of the interleaver 66 use a round-robin bit interleaving scheme to deterministically separate adjacent bits of the turbo block into different frames. In the round-robin scheme, the first bit of the turbo block is scheduled in the first frame (frame 1), but the second bit is scheduled in the second frame (frame 2), the third bit is scheduled in the third frame (frame 3), and the fourth bit is scheduled in the fourth frame (frame 4). The process then process wraps back around so the fifth bit is scheduled in fame 1, and so on. The result is shown in FIG. 7 where, for example, successive adjacent bits of the turbo block are allocated to respectively different frames of a superframe. FIG. 8 illustrates an example of the results obtained using the round-robin bit interleaving scheme for a rate 2/3 turbo code with four frames per superframe.

Figure 9:
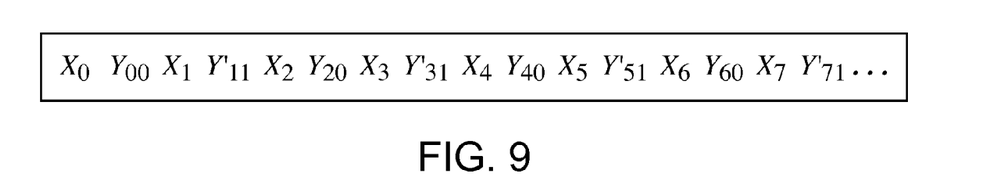
Figure 10:
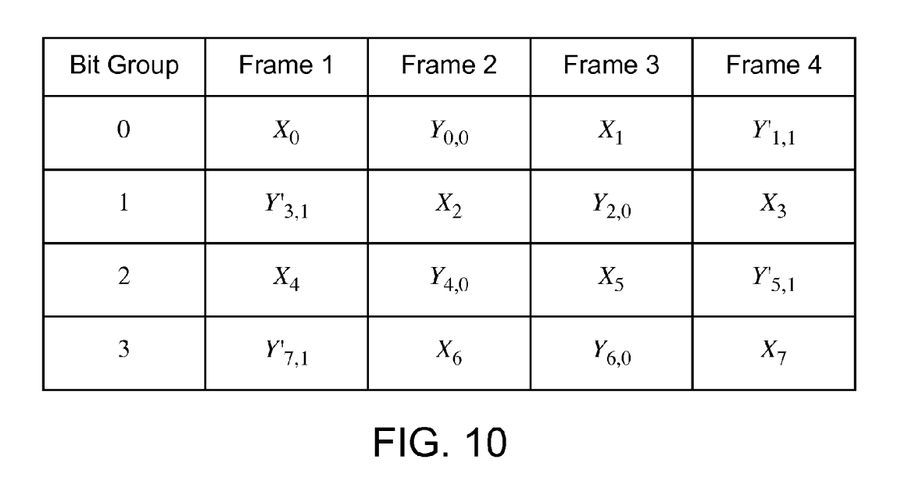

FIG. 9 illustrates the output bits produced by a rate 1/2 turbo encoder. It can be seen from FIG. 9 that, using the round-robin scheme, half of the systematic bits would be scheduled in frame 1, with the other half of the systematic bits scheduled in frame 3. This phenomenon also in fact occurs in the rate 2/3 code example shown in FIG. 8. For the rate 1/2 code, however, some embodiments apply a single cyclic bit shift to every other group of four bits in the turbo block, beginning with the fifth through eighth bits, and again for the thirteenth through sixteenth bits, and so on. This cyclic bit shifting is performed before the round robin interleaving scheme is implemented. The result obtained by using the cyclic bit shift for the rate 1/2 code example of FIG. 9, with four frames per superframe and round-robin bit interleaving, is shown in FIG. 10. Bit group 1 contains the cyclic-shifted version of the fifth through eighth bits ($Y'_{3,1}$ cycled around to the location where $X_2$ would otherwise appear), and Bit group 3 contains the cyclic-shifted version of the thirteenth through sixteenth bits ($Y'_{7,1}$ cycled around to the location where $X_6$ would otherwise appear). FIG. 10 shows that, with the cyclic bit shifts, the systematic bits are advantageously distributed across all four frames of the superframe, rather than being confined to frames 1 and 3.

Figure 6D:
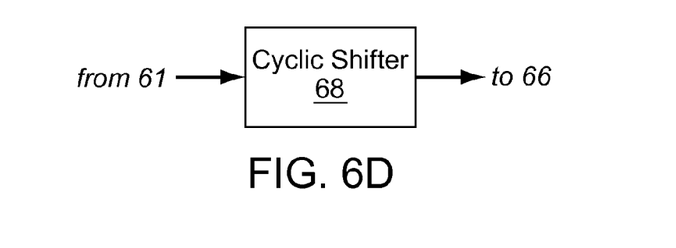

FIG. 6D diagrammatically illustrates exemplary embodiments that employ the above-described cyclic bit shifting. A cyclic bit shifter 68 receives each turbo block from the turbo encoder 61, and produces a corresponding cyclic shifted block wherein selected groups of bits are cyclic shifted among themselves by a selected amount. This cyclic shifted block is provided to the interleaver 66, which produces a corresponding bit interleaved block in the manner described above. The bit interleaved block is then processed by the superframe constructor 42.

It will be appreciated from FIGS. 6A-6D that, in various embodiments, various combinations of the interleaver 66, the cyclic bit shifter 68 and the superframe constructor 42 cooperate to serve as a scheduler that schedules the content of the turbo blocks as desired for transmission by the transmit unit 43.

Figure 11A:
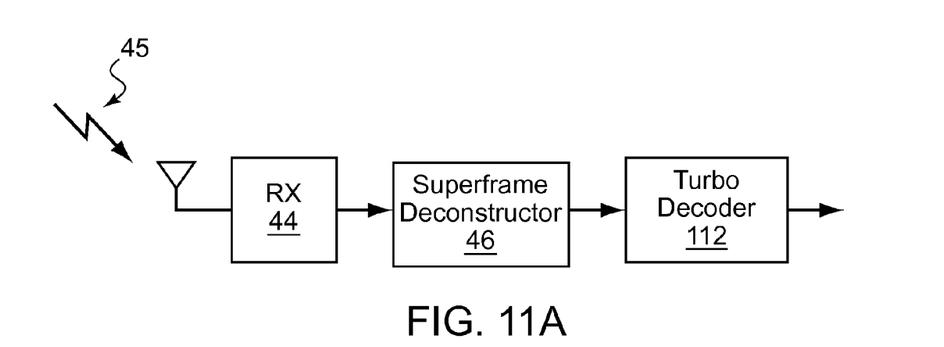
FIGS. 11A-11C diagrammatically illustrate a receiver end of a communication system according to exemplary embodiments of the present work.

FIG. 11A diagrammatically illustrates exemplary embodiments of a receiver end arrangement for use in a communication system having a transmit end arrangement such as shown in and described with respect to FIG. 6A. The receiver end of FIG. 11A is generally similar to the receiver end shown in and described with respect to FIG. 4, but includes a turbo decoder 112 that decodes the extended length turbo blocks received from a superframe deconstructor 46. The turbo decoder 112 produces received versions of the composite packets, for example, the composite packets 51 of FIG. 5, that were turbo encoded by the turbo encoder 61 at the transmit end of FIG. 6A.

Figure 11B:
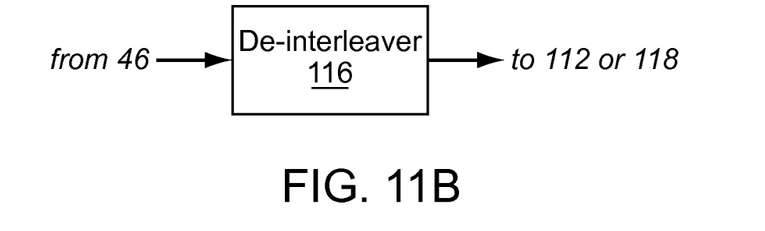

FIG. 11B diagrammatically illustrates exemplary receiver end embodiments that support interleaving techniques such as described above with respect to the interleaver 66 of FIG. 6B. In various embodiments, the de-interleaver 116 of FIG. 11B receives the turbo blocks from superframe deconstructor 46, and performs de-interleaving operations complementary to the interleaving operations performed by the interleaver 66 of FIG. 6B. The de-interleaver 116 provides its results, in various embodiments, to either the turbo decoder 112 of FIG. 6A, or to a cyclic shifter 118 shown in FIG. 11C and described below.

Figure 11C:
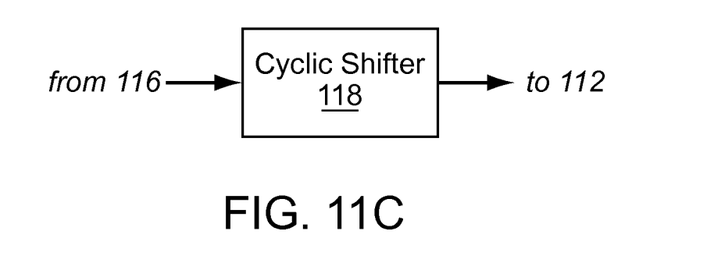

FIG. 11C diagrammatically illustrates exemplary receiver end embodiments that support cyclic bit shifting techniques such as described above with respect to the cyclic shifter 68 of FIG. 6D. In various embodiments, the cyclic shifter 118 of FIG. 11C receives the output of de-interleaver 116, and performs cyclic shifting operations complementary to the cyclic shifting operations performed by the cyclic shifter 68 of FIG. 6D. The cyclic shifted results produced by the cyclic shifter 118 are provided to the turbo decoder 112.

Figure 12:
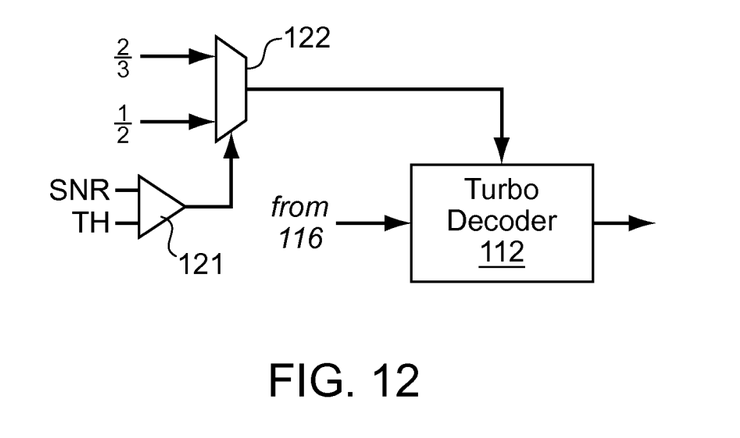
FIG. 12 diagrammatically illustrates turbo decoder control at the receiver end of a communication system according to exemplary embodiments of the present work.

As mentioned above with respect to FIG. 9, if a rate 1/2 turbo code with round-robin bit interleaving is implemented without the cyclic shifting provided at 68 in FIG. 6D, all systematic bits will be confined to frames 1 and 3 of the superframe. Moreover, as seen from FIG. 9, all of the parity bits are transmitted in frames 2 and 4. Exemplary embodiments of the present work exploit this phenomenon in situations where the signal-to-noise ratio (SNR) associated with the communication link 45 is acceptably high, by implementing rate 2/3 turbo decoding at the receiver end, using only the parity bits transmitted in frame 2, and ignoring the remaining parity bits transmitted in frame 4. Because the portions of the turbo block contained in frame 4 are ignored, the receiver end need not "wake up" to receive them during frame 4, thereby achieving power savings, which may be important if the receiver is a portable (e.g., hand-held) device. FIG. 12 diagrammatically illustrates such a receiver end arrangement according to exemplary embodiments of the present work.

As shown in FIG. 12, a selector 122 provides turbo decoder 112 (see also FIG. 11A) with an indication regarding whether rate 1/2 or rate 2/3 turbo decoding is to be used. The selection made by selector 122 is controlled by the output of a comparator 121 that compares the SNR currently associated with the communication link 45 to a threshold value TH. If the SNR exceeds the threshold value TH, the comparator output causes the selector 122 to select rate 2/3 turbo decoding, thereby instructing the turbo decoder 112 to use rate 2/3 turbo decoding, and to ignore the frame 4 parity bits. If the SNR does not exceed the threshold TH or if the decoding of the rate 2/3 code fails, the comparator output causes the selector 122 to select rate 1/2 turbo decoding by including the received signal samples in the fourth frame, thereby instructing the turbo decoder 112 to use rate 1/2 turbo decoding as usual.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method of processing a stream of extended length turbo-coded data blocks for transmission on a wireless communication link, comprising:
    for every extended length turbo-coded data block from the stream of extended length turbo-coded data blocks, wherein an extended length turbo-coded data block comprises a plurality of turbo coded packets wherein the bits of each packet are turbo encoded to produce a turbo coded packet, performing a cyclic bit shifting in a single cyclic shifter of all of the bits of the extended length turbo-coded data block such that selected groups of bits of the extended length turbo-coded data block are cyclically shifted among themselves by a selected amount to produce a corresponding cyclically shifted data block;
    interleaving each corresponding cyclically shifted data block to produce a corresponding interleaved data block;
    scheduling a plurality of portions of the corresponding interleaved data block for transmission during respectively corresponding frames transmit intervals that are temporally separated from one another; and
    transmitting the plurality of portions during the respectively corresponding frames transmit intervals according to said scheduling,
    wherein the frames transmit intervals are equal in length and equally separated from one another temporally, and wherein at least every other portion of the plurality of portions transmitted during the respectively corresponding frames transmit intervals comprises at least one systematic bit,
    wherein said interleaving comprises applying bit-level interleaving the corresponding cyclically shifted data block,
    wherein a round-robin bit interleaving scheme is used to deterministically separate adjacent bits of the corresponding cyclically shifted data block into different sub-frames.

2. The method of claim 1, wherein each of the plurality of portions comprises a plurality of bits.

3. The method of claim 1, further comprising encoding an N number of medium access control (MAC) packets into a turbo packet block, and wherein the plurality of portions comprises N number of packets.

4. The method of claim 1, wherein the corresponding interleaved data block is scheduled for transmission on a single sub-flame within a flame.

5. The method of claim 1, wherein the corresponding interleaved data block is extended across multiple sub-flames of a flame.

6. The method of claim 5, wherein the corresponding interleaved data block is divided into a plurality of sub-blocks, and each sub-block is scheduled in a different sub-frame of the flame.

7. The method of claim 1, further comprising: scheduling adjacent bits of the corresponding interleaved data block in different sub-frames.

8. The method of claim 1, wherein systematic bits are confined to every other portion of the plurality of portions transmitted during the respectively corresponding transmit intervals.

9. An apparatus for processing a stream of extended length turbo-coded data blocks for transmission on a wireless communication link, comprising:
    a single cyclic bit shifter configured to shift all of the bits of every extended length turbo-coded data block such that selected groups of bits are cyclically shifted among themselves by a selected amount to produce a corresponding cyclically shifted data block, wherein an extended length turbo-coded data block comprises a plurality of turbo coded packets wherein the bits of each packet are turbo encoded to produce a turbo coded packet;
    an interleaver operatively coupled to the cyclic bit shifter and configured to interleave each corresponding cyclically shifted data block to produce a corresponding interleaved data block;
    a scheduler operatively coupled to the interleaver and configured for scheduling a plurality of portions of the corresponding interleaved data block for transmission during respectively corresponding frames transmit intervals that are temporally separated from one another; and
    a transmitter coupled to the scheduler and configured to transmit the plurality of portions during the respectively corresponding frames transmit intervals according to said scheduling, wherein the frames transmit intervals are equal in length and equally separated from one another temporally, and wherein at least every other portion of the plurality of portions configured to be transmitted during the respectively corresponding frames transmit intervals comprises at least one systematic bit,
    wherein the interleaver is further configured to apply bit-level interleaving to the corresponding cyclically shifted data block,
    wherein a round-robin bit interleaving scheme is used to deterministically separate adjacent bits of the corresponding cyclically shifted data block into different sub-frames.

10. The apparatus of claim 9, further comprising an encoder for encoding an N number of medium access control (MAC) packets into a turbo packet block, and wherein the plurality of portions comprises N number of packets.

11. The method of claim 9, wherein the corresponding interleaved data block is scheduled for transmission on a single sub-flame within a flame.

12. The method of claim 9, wherein the corresponding interleaved data block is extended across multiple sub-flames of a flame.

13. The method of claim 12, wherein the corresponding interleaved data block is divided into a plurality of sub-blocks, and each sub-block is scheduled in a different sub-frame of the flame.

14. The method of claim 9, further comprising: scheduling adjacent bits of the corresponding interleaved data block in different sub-frames.

15. The method of claim 9, wherein systematic bits are confined to every other portion of the plurality of portions transmitted during the respectively corresponding transmit intervals.

16. An apparatus for processing a stream of extended length turbo-coded data blocks for transmission on a wireless communication link, comprising:
    means for performing a cyclic bit shifting of all of the bits of every extended length turbo-coded data block in a single cyclic shifter such that selected groups of bits are cyclically shifted among themselves by a selected amount to produce a corresponding cyclically shifted data block, wherein an extended length turbo-coded data block comprises a plurality of turbo coded packets wherein the bits of each packet are turbo encoded to produce a turbo coded means for interleaving each corresponding cyclically shifted data block to produce a corresponding interleaved data block;

means for scheduling a plurality of portions of each corresponding interleaved data block for transmission during respectively corresponding frames transmit intervals that are temporally separated from one another; and means for transmitting the plurality of portions during the respectively corresponding flames transmit intervals according to said scheduling, wherein the frames transmit intervals are equal in length and equally separated from one another temporally, and wherein at least every other portion of the plurality of portions for transmitting during the respectively corresponding frames transmit intervals comprises at least one systematic bit, wherein said means for interleaving comprises applying bit-level interleaving to each turbo packet block, wherein a round-robin bit interleaving scheme is used to deterministically separate adjacent bits of the corresponding cyclically shifted data block into different sub-frames.

17. The apparatus of claim 16, further comprising a means for encoding an N number of medium access control (MAC) packets into a turbo packet wherein the plurality of portions comprises N number of packets.

18. The apparatus of claim 16, wherein the corresponding interleaved data block is scheduled for transmission on a single sub-frame within a frame.

19. The apparatus of claim 16, wherein the corresponding interleaved data block is extended across multiple sub-frames of a frame.

20. The apparatus of claim 19, wherein the corresponding interleaved data block is divided into a plurality of sub-blocks, and each sub-block is scheduled in a different sub-frame of the frame.

21. The apparatus of claim 16, further comprising:
scheduling adjacent bits of the corresponding interleaved data block in different frames.

22. The method of claim 16, wherein systematic bits are confined to every other portion of the plurality of portions transmitted during the respectively corresponding transmit intervals.

23. A computer program product, comprising: a non-transitory computer-readable medium comprising:
code for causing at least one data processor to perform a cyclic bit shift of all of the bits of every extended length turbo-coded data block of a stream of extended length turbo-coded data blocks in a single cyclic shifter such that selected groups of bits are cyclically shifted among themselves by a selected amount to produce a corresponding cyclically shifted data block, wherein an extended length turbo-coded data block comprises a plurality of turbo coded packets wherein the bits of each packet are turbo encoded to produce a turbo coded packet;

code for causing at least one data processor to interleave each corresponding cyclically shifted data block to produce a corresponding interleaved data block;

code for causing at least one data processor to schedule a plurality of portions of each corresponding interleaved data block for transmission during respectively corresponding flames transmit intervals that are temporally separated from one another;

code for causing the at least one data processor to effectuate transmission of the plurality of portions during the respectively corresponding flames transmit intervals according to said scheduling, wherein the flames transmit intervals are equal in length and equally separated from one another temporally; and code for causing the at least one data processor to configure at least every other portion of the plurality of portions for transmission during the respectively corresponding frames transmit intervals to comprise at least one systematic bit, wherein said code for causing at least one data processor to interleave comprises applying bit-level interleaving to the corresponding cyclically shifted data block, wherein a round-robin bit interleaving scheme is used to deterministically separate adjacent bits of the corresponding cyclically shifted data block into different sub-frames.

24. The computer program product of claim 23, further comprising a code for causing encoding an N number of medium access control (MAC) packets into the turbo-coded data block, and wherein the plurality of portions comprise N number of packets.

25. The computer program product of claim 23, wherein the corresponding interleaved data block is scheduled for transmission on a single sub-flame within a frame.

26. The computer program product of claim 23, wherein the corresponding interleaved data block is extended across multiple sub-frames of a frame.

27. The computer program product of claim 26, wherein the corresponding interleaved data block is divided into a plurality of sub-blocks, and each sub-block is scheduled in a different sub-frame of the frame.

28. The computer program product of claim 23, further comprising: scheduling adjacent bits of the corresponding interleaved data block in different frames.

29. The method of claim 23, further comprising code for causing the at least one data processor to confine systematic bits to every other portion of the plurality of portions transmitted during the respectively corresponding transmit intervals.

* * * * *